United States Patent
Ye et al.

(10) Patent No.: US 11,165,423 B2
(45) Date of Patent: Nov. 2, 2021

(54) POWER SWITCH DRIVE CIRCUIT AND DEVICE

(71) Applicant: Shanghai Zhuanxin Corporation Management Consulting Partnership, Shanghai (CN)

(72) Inventors: Zhong Ye, Plano, TX (US); Danyang Zhu, Cary, NC (US)

(73) Assignee: Shanghai Zhuanxin Corporation Management Consulting Partnership, Shanghai (CN)

( * ) Notice: Subject to any disclaimer, the term of this patent is extended or adjusted under 35 U.S.C. 154(b) by 0 days.

(21) Appl. No.: 17/069,113

(22) Filed: Oct. 13, 2020

(65) Prior Publication Data

US 2021/0028782 A1 Jan. 28, 2021

Related U.S. Application Data

(63) Continuation of application No. PCT/CN2019/070648, filed on Jan. 7, 2019.

(30) Foreign Application Priority Data

Aug. 8, 2018 (CN) .......................... 201810896181.9

(51) Int. Cl.
| | |
|---|---|
| H03K 3/00 | (2006.01) |
| H03K 17/08 | (2006.01) |
| H03K 17/687 | (2006.01) |
| H03K 19/00 | (2006.01) |
| H03K 17/567 | (2006.01) |
| H03K 17/0812 | (2006.01) |

(52) U.S. Cl.
CPC ..... *H03K 17/567* (2013.01); *H03K 17/08122* (2013.01)

(58) Field of Classification Search
None
See application file for complete search history.

(56) References Cited

U.S. PATENT DOCUMENTS

| | | | |
|---|---|---|---|
| 9,172,306 B2 | 10/2015 | Clavette et al. | |
| 9,774,322 B1 * | 9/2017 | Duduman | ............... H02M 3/07 |
| 9,800,245 B2 * | 10/2017 | Dighrasker | ............. H02M 3/07 |

FOREIGN PATENT DOCUMENTS

| | | |
|---|---|---|
| CN | 102684462 A | 9/2012 |
| CN | 202424487 U | 9/2012 |
| CN | 203313043 U | 11/2013 |
| CN | 203406774 U | 1/2014 |
| CN | 104506028 A | 4/2015 |
| CN | 108539964 A | 9/2018 |
| JP | 2014027345 A | 2/2014 |

* cited by examiner

*Primary Examiner* — Kenneth B Wells
(74) *Attorney, Agent, or Firm* — Slater Matsil, LLP

(57) ABSTRACT

The invention relates to the field of power semiconductor devices. This invention discloses a drive circuit and device of a power switch. The input terminal of the drive circuit receives a pulse signal; the output terminal of the drive circuit is connected to a capacitor circuit. The capacitor circuit is used to provide a negative voltage for a first electrode of the power switch to turn off the power switch when the pulse signal is a turn-off signal; the drive circuit includes a capacitance adjustment unit. The capacitance adjustment unit includes a negative voltage adjustment element that can charge a capacitor whose voltage is lower than a predetermined voltage when the pulse signal is the turn-off signal.

20 Claims, 8 Drawing Sheets

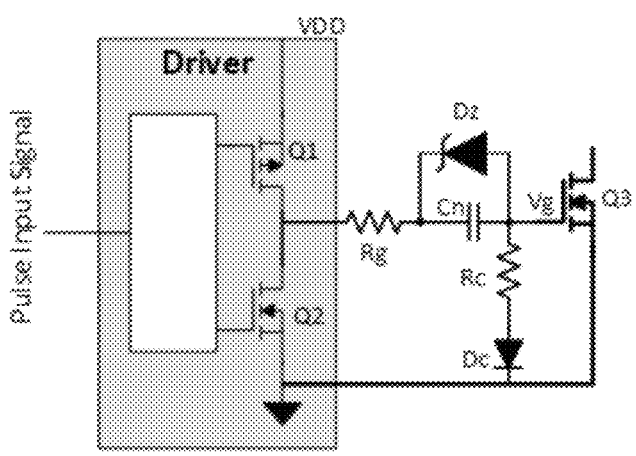
Figure 1(a)    (Prior Art)

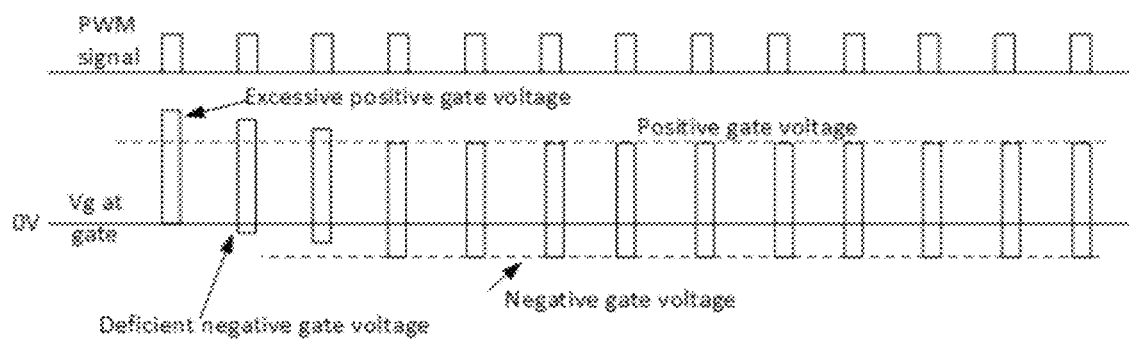
Figure 2    (Prior Art)

POWER SWITCH DRIVE CIRCUIT AND DEVICE

CROSS-REFERENCE TO RELATED APPLICATIONS

This application is a continuation application of International Application No. PCT/CN2019/070648, filed on Jan. 7, 2019, which claims priority to Chinese Patent Application No. CN201810896181.9, filed on Aug. 8, 2018. The disclosures of the aforementioned applications are hereby incorporated herein by reference in their entireties.

TECHNICAL FIELD

The invention relates to the field of power semiconductor devices, in particular to a drive circuit and device of a power switch.

BACKGROUND

Power semiconductor drive circuits are mainly used for driving power semiconductor switching devices such as devices formed of silicon carbide, silicon, gallium nitride, etc. Power semiconductor drive circuits are widely used in the design of power converters. These power converters include AC/DC converters, DC/DC converters, and DC/AC converters. Terminal equipment that uses these power converters includes power supplies, motor drive equipment, solar energy conversion equipment, new energy vehicles, etc.

The structures of the existing drive circuits are shown in FIGS. 1(a)-(c). Among them, the drive circuit including field effect transistors (MOS) Q1 and Q2 receives an input pulse signal. After power and level amplification, the drive circuit generates a drive signal for controlling the on and off of the power switch Q3. Cn is a capacitor. Rg and Rc are Resistors. Dc is a diode. Dz is a Zener diode. VDD is a power supply voltage.

The circuit shown in FIG. 1(a) is the simplest solution to provide a negative voltage for the gate drive voltage Vg of Q3 when a turn-off signal is received. However, when the Pulse Width Modulation (PWM) signal is activated, the initial storage voltage of the capacitor (Cn) may be zero or lower than a predetermined voltage after the voltage of the capacitor has been discharged. In a certain period of time after the signal has been activated, this will cause the positive gate voltage to be too high, and the negative gate voltage to be insufficient (as shown in FIG. 2). Moreover, in this circuit, the capacitor can be charged only when the PWM signal (e.g., pulse signals) is a high-level signal. If the PWM signal (e.g., pulse signals) is in a low-level state (such as an idle state) for a long time, the capacitor cannot be replenished in time. The voltage of the capacitor may drop due to leakage or other interference factors. This may result in insufficient negative voltage on the gate, which is unable to maintain a reliable shutdown of the power switch before the power switch is switched on again, thus causing reliability issues of the power switch and its associated drive circuit. Especially for silicon carbide Metal-Oxide-Semiconductor Field-Effect Transistor (SiC MOSFET), it usually has a narrow positive gate voltage range and a lower gate threshold voltage.

The drive circuit shown in FIG. 1(b) uses an external simple circuit comprising Cn and Dz to generate a negative voltage. This circuit solves the startup problem in FIG. 1(a). However, this circuit requires a separate isolated bias voltage (e.g., voltage source +V). In this circuit, the simple bootstrap circuit cannot be used to power the high-side drive circuit of a half-bridge, which will add great complexity to the system, thereby increasing the cost of the circuit.

The drive circuit shown in FIG. 1(c) simplifies the entire circuit, but the circuit requires two isolated bias voltages (+V and −V) having positive and negative voltages to generate the negative bias required by the power switch. The isolated bias voltages can add a lot of complexity to the system.

Therefore, there is an urgent need to provide a simple, reliable, low pin count, but fully functional IC integrated circuit solution to realize the gate drive function of the power switch device.

SUMMARY OF THE INVENTION

The object of the present invention is to provide a drive circuit for a power switch. This drive circuit can maintain the capacitor voltage when the pulse signal is off for a long time. The drive circuit can provide a stable negative voltage for the power switch to maintain the turn off of the power switch.

In order to solve the technical problems above, the embodiments of the present invention disclose a drive circuit for a power switch. The input terminal of the drive circuit receives a pulse signal. The pulse signal includes a turn-on signal for controlling the power switch to be turned on and a turn-off signal for controlling the power switch to be turned off. The output terminal of the drive circuit is connected to a capacitor circuit. The capacitor circuit is used to provide a negative voltage for a first electrode of the power switch to turn off the power switch when the pulse signal is a turn-off signal;

The drive circuit includes a capacitance adjustment unit. The capacitance adjustment unit includes a negative voltage adjustment element that can charge a capacitor whose voltage is lower than a predetermined voltage when the pulse signal is the turn-off signal. The capacitor is included in the capacitor circuit.

In an exemplary embodiment, the negative voltage adjustment element includes a negative voltage charge pump, which is used to charge the capacitor whose voltage is lower than the predetermined voltage when the drive circuit receives the turn-off signal.

In an exemplary embodiment, the negative voltage charge pump is connected in parallel with the capacitor circuit, and the low voltage end of the capacitor is connected to the first electrode of the power switch.

In an exemplary embodiment, the capacitance adjusting unit further includes a positive voltage adjustment element, which is used to charge the capacitor whose voltage is lower than a predetermined voltage when the drive circuit receives a turn-on signal.

In an exemplary embodiment, the positive voltage adjustment element includes a first resistor and a diode connected in series;

The first terminal of the first resistor is connected to the low voltage end of the capacitor. The second terminal of the first resistor is connected to the anode of the diode. The cathode of the diode is connected to ground.

In an exemplary embodiment, the capacitance adjustment unit further includes an over-voltage adjustment element for clamping the voltage of the capacitor to a predetermined voltage when the voltage of the capacitor exceeds the predetermined voltage.

In an exemplary embodiment, the drive circuit further includes a charging unit for charging the capacitor with a current source in the charging unit when the drive circuit is started, and, When the charging unit charges the capacitor, the low voltage end of the capacitor and a second electrode of the power switch are both grounded.

In an exemplary embodiment, the charging unit further includes a first switch and a second switch;

The current source, the first switch, the capacitor circuit and the second switch are connected in series;

The first terminal of the second switch is connected to the low voltage end of the capacitor, and the second terminal of the second switch is grounded;

When the capacitor is charged, the current source, the first switch, the capacitor circuit and the second switch form a current path.

In another exemplary embodiment, the current source may be a voltage source with a current limiting function, and the output value of the voltage source is equal to the predetermined voltage of the capacitor.

In an exemplary embodiment, the drive circuit further includes a power amplifying unit and a control unit;

The power amplifying unit is used to amplify the pulse signal received by the drive circuit and output it;

The control unit is used for turning off the power switch through a clamping circuit when the power supply voltage is lower than a first predetermined voltage and/or the voltage of the capacitor is lower than a second predetermined voltage.

In an exemplary embodiment, the drive circuit satisfies at least one of the following conditions:

When the power switch is a bipolar transistor, the first electrode is the base, and the second electrode is the emitter; when the power switch is a field effect transistor, the first electrode is the gate, and the second electrode is the source;

The power switch is a silicon carbide, silicon or gallium nitride field effect transistor;

The over-voltage adjustment element includes a Zener diode.

The embodiment of the present invention also discloses a drive device for a power switch. The drive device includes the drive circuit disclosed above and a capacitor circuit connected to the output terminal of the drive circuit.

The embodiment of the present invention also discloses a drive device for a power switch. The drive device includes the drive circuit disclosed above, a capacitor circuit connected to the output terminal of the drive circuit, and a pulse circuit generating a pulse signal.

The embodiment of the present invention also discloses a drive device for a power switch, which includes a second resistor, a capacitor and a negative voltage charge pump;

The second resistor is connected in series with the capacitor. The high voltage end of the capacitor is connected to the first terminal of the second resistor, and the low voltage end of the capacitor is connected to the first electrode of the power switch and the first terminal of the negative voltage charge pump;

The second terminal of the second resistor is connected to the second terminal of the negative voltage charge pump, and the second terminal of the second resistor receives the pulse signal that controls the turning on and off of the power switch;

The second electrode of the power switch is grounded.

In an exemplary embodiment, the drive device further includes a current source, a first switch and a second switch;

The current source, the first switch, the second resistor, the capacitor and the second switch are connected in series;

The first terminal of the second switch is connected to the low voltage end of the capacitor, and the second terminal of the second switch is grounded;

When charging the capacitor, the first switch and the second switch transition from a turn-off state to a turn-on state. The current source, the first switch, the second resistor, the capacitor and the second switch form a current path.

Compared with the prior art, the main differences and effects of the embodiments of the present invention are:

Without additional power supplies, when the pulse signal is a turn-off signal for a long time (such as an idle time), it can promptly supplement the loss of stored power due to leakage of the capacitor, thereby providing a stable turn-off negative voltage for the power switch.

Furthermore, after the capacitor is charged to the required predetermined voltage, a low-power negative voltage charge pump can be used to charge the capacitor and keep it at the predetermined voltage, thereby saving the circuit area and reducing the circuit cost while maintaining the negative voltage for a long time.

Furthermore, when the drive module receives the turn-on signal, the first resistor and the diode can charge the capacitor when the capacitor voltage is lower than the predetermined voltage.

Furthermore, the capacitor can be quickly charged when the drive circuit is started or restarted, effectively avoiding the problems of excessively high positive voltage or insufficient negative voltage on the gate of the power switch. At the same time, grounding the first and second electrodes of the power switch simultaneously when the capacitor is charged can ensure that the power switch remains off during the charging period of the capacitor, thereby improving the capacitor charging efficiency while ensuring the reliability of the circuit.

Furthermore, the over-voltage adjustment element can clamp the voltage of the capacitor to a predetermined voltage to avoid overcharging.

Furthermore, when the power supply voltage is too low or the capacitor voltage is too low, the gate or base voltage of the power switch can be pulled down to zero volts through the Miller clamping pin to turn off the power switch and protect the circuit.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 2 is a timing diagram of the gate voltage in FIG. 1(a) as a function of the PWM signal;

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the embodiments of this disclosure are discussed in detail below. It should be appreciated, however, that the concepts disclosed herein can be embodied in a wide variety of specific contexts. The specific embodiments discussed are merely illustrative, and do not limit the scope of the claims.

In the following description, many technical details are provided for the reader to better understand the application. However, those of ordinary skill in the art can understand that even without these technical details and various changes and modifications based on the following embodiments, the technical solutions required by the claims of this application can be implemented.

It can be understood that in the present invention, the low voltage end of the capacitor refers to the end of the capacitor with a lower voltage (such as the negative plate of the capacitor), and correspondingly, the high voltage end refers to the end with a higher voltage (such as the positive plate of the capacitor).

In addition, it can be understood that, in the present invention, the power switch may be various types of switches, which is not limited herein. Preferably, the power switch is a silicon carbide, silicon or gallium nitride field effect transistor. When the power switch is a bipolar transistor, the first electrode is the base and the second electrode is the emitter; when the power switch is a field effect transistor, the first electrode is the gate and the second electrode is the source.

In addition, it can be understood that the predetermined voltage in the present invention refers to the negative voltage charged in the capacitor for maintaining the power switch in the off state when the drive circuit is started or restarted. The capacitor of the present invention can be a single capacitor, or a capacitor circuit composed of multiple capacitors in parallel and/or in series. It is worth noting that the voltage of the capacitor of the present invention is much higher than the voltage of the parasitic capacitor between the gate and source (or base and emitter) of the power switch, such as more than ten times, so as to ensure that when the pulse signal is applied, the power switch is controlled to be turned off or on, and the negative voltage on the capacitor remains basically unchanged.

In addition, it can be understood that in the present invention, both PWM and pulse signals refer to pulse signals used to control the on and off of the power switch. This time, the pulse circuit that generates the pulse signal can be an analog controller or a digital controller.

In order to make the objectives, technical solutions and advantages of the present invention clearer, the embodiments of the present invention will be described in further detail below in conjunction with the accompanying drawings.

Figure 1B:
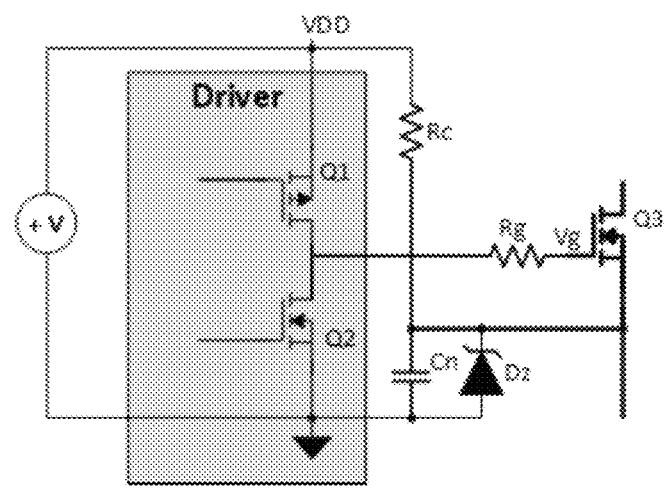
FIGS. 1 (a)-(c) are schematic diagrams of the circuit structures of the drive circuits of the power switch in the prior art.
Figure 1C:
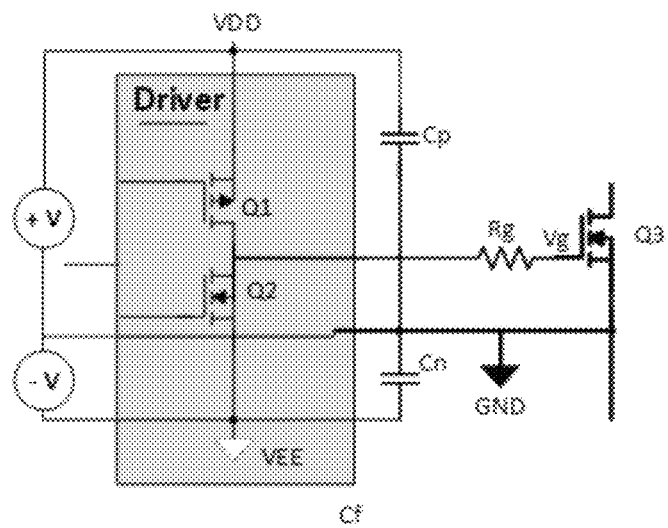
Figure 3:
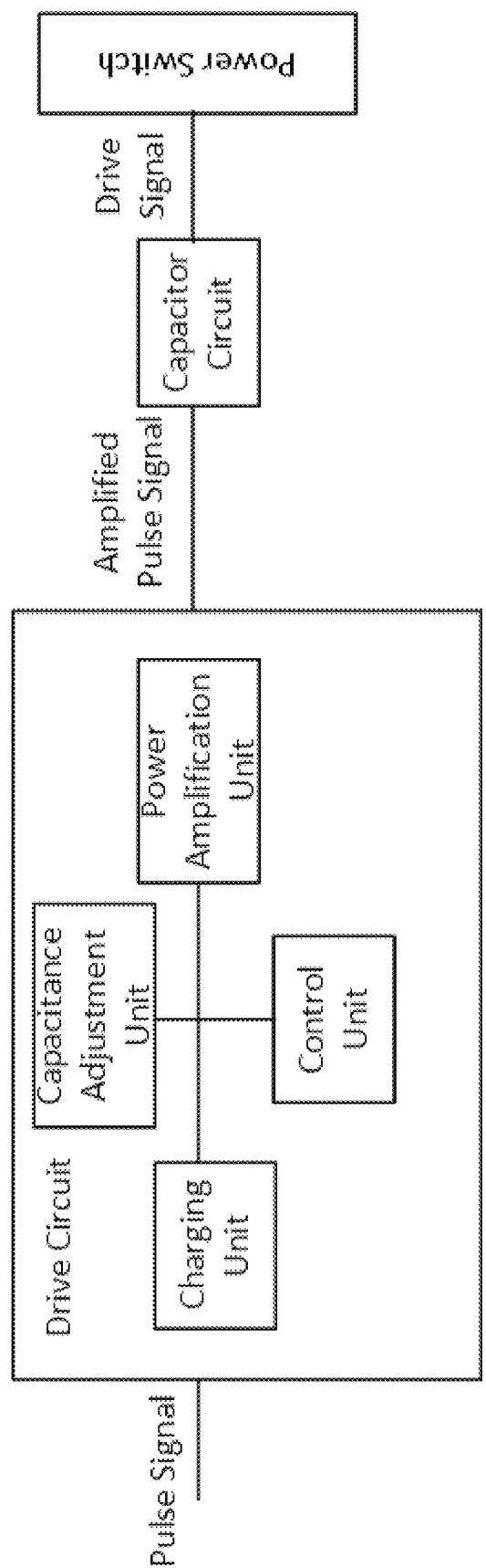
FIG. 3 is a block diagram of a power switch and its drive circuit according to an embodiment of the present invention.

The first embodiment of the present invention relates to a drive circuit of a power switch. FIG. 3 is a block diagram of the drive circuit.

Specifically, as shown in FIG. 3, the input terminal of the drive circuit receives a pulse signal. The pulse signal includes a turn-on signal and a turn-off signal for controlling the turn-on and turn-off of the power switch; the output terminal of the drive circuit is connected to the capacitor circuit. The capacitor circuit is used to provide a negative voltage applied to the first electrode of the power switch to turn off the power switch when the pulse signal is a turn-off signal. The drive circuit includes a capacitance adjustment unit, a charging unit, a power amplification unit, and a control unit.

Figure 4:
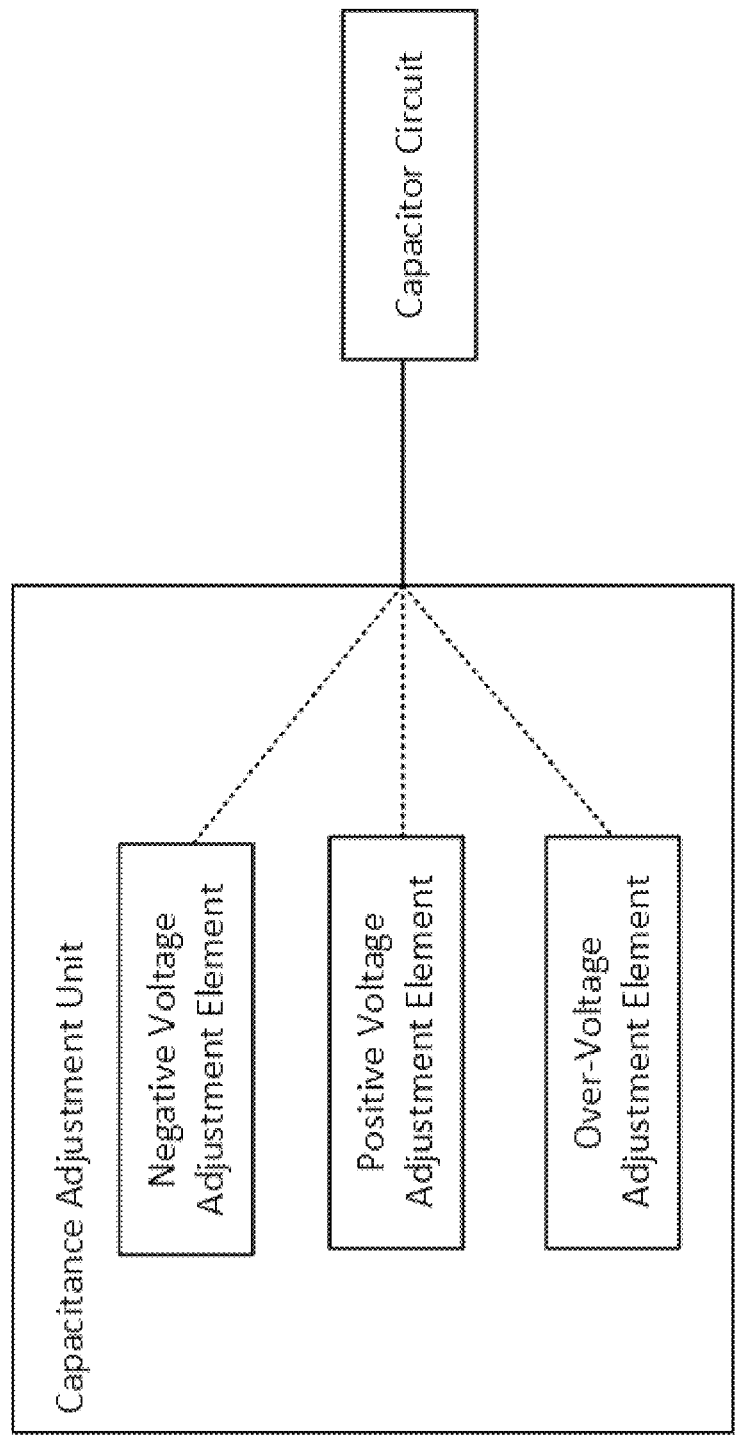
FIG. 4 is a block diagram of a capacitance adjustment unit according to an embodiment of the present invention.

FIG. 4 is a block diagram of the structure of the capacitance adjustment unit. As shown in FIG. 4, the capacitance adjustment unit includes a negative voltage adjustment element, a positive voltage adjustment element, and an over-voltage adjustment element. The negative voltage adjustment element can charge a capacitor whose voltage is lower than a predetermined voltage when the pulse signal is a turn-off signal. The capacitor is included in the capacitor circuit. Preferably, the negative voltage adjustment element includes a negative voltage charge pump for charging the capacitor whose voltage is lower than the predetermined voltage when the drive circuit receives the turn-off signal. The positive voltage adjustment element is used to charge the capacitor whose voltage is lower than the predetermined voltage when the drive circuit receives the turn-on signal. The over-voltage adjustment element is used to clamp the voltage of the capacitor to the predetermined voltage when the voltage of the capacitor exceeds the predetermined voltage. It can be understood that, in some exemplary embodiments of the present invention, the negative voltage charge pump can only charge a capacitor with a voltage lower than the predetermined voltage when the drive circuit receives a turn-off signal. Alternatively, the negative voltage charge pump can be set to charge the capacitor whose voltage is lower than the predetermined voltage when the drive circuit receives the turn-off signal, or the negative voltage charge pump can be set to charge the capacitor whose voltage is lower than the predetermined voltage when the drive circuit receives the turn-on signal.

The charging unit is used to charge the capacitor when the drive circuit is started. Preferably, in an exemplary embodiment, the charging unit includes a current source. The current source charges the capacitor when the drive circuit is activated. In another exemplary embodiment, the current source may be a voltage source with a current limitation, and the output voltage of the voltage source is the predetermined voltage of the capacitor.

The power amplifying unit is used to amplify the pulse signal received by the drive circuit and output it.

The control unit is used to turn off the power switch through the clamping circuit when the power supply voltage is lower than a first predetermined voltage and/or the voltage of the capacitor is lower than a second predetermined voltage.

Figure 5:
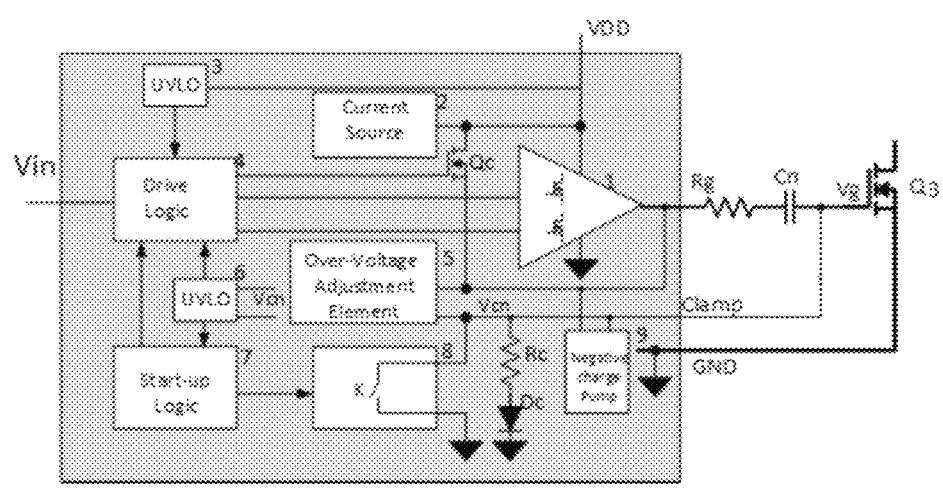
FIG. 5 is a schematic diagram of the circuit structure of a power switch and its drive circuit according to an embodiment of the present invention.

The embodiments above are the blocks of the circuit involved in the core idea of the present invention. In order to describe the technical solution of the present invention in more detail, FIG. 5 shows a schematic diagram of the circuit structure of the drive circuit of the power switch in an exemplary example. As shown in FIG. 5, the drive circuit includes a pulse signal input, a power amplifier unit 1, a current source 2, an under-voltage monitor UVLO 3 and an under-voltage monitor UVLO 6, a drive logic 4, an over-voltage adjustment element 5, a start logic unit 7, a second switch K 8, a negative voltage charge pump 9, a first resistor Rc, a diode Dc, a second resistor Rg, a capacitor Cn, and a first switch Qc. Moreover, in this example, the power transistor Q3 is an NMOS transistor, and its source is grounded. It can be understood that the type of power switch applicable to the drive circuit of the present invention is not limited to this, and may be other types of switches.

In this circuit, the negative voltage charge pump 9, the over-voltage adjustment element 5, the first resistor Rc and the diode Dc form a capacitance adjustment unit. Among them, the negative voltage charge pump 9 is used as a negative voltage adjustment element. The first resistor Rc and the diode Dc form a positive voltage adjustment element. The over-voltage adjustment element 5 preferably uses a Zener diode. The capacitor circuit comprises the capacitor Cn and the second resistor Rg. As shown in FIG. 5, the negative voltage charge pump 9 is connected in parallel with the capacitor Cn. The first terminal of the negative voltage charge pump 9 is connected to the low voltage end of the capacitor Cn, and the second terminal of the negative voltage charge pump 9 is connected to the second terminal of the second resistor Rg connected in series to the capacitor Cn. At the same time, the low voltage end of the capacitor Cn is connected to the gate of the power switch Q3, and the high voltage end of the capacitor Cn is connected to the first terminal of the second resistor Rg. The first terminal of the first resistor Rc is connected to the low voltage end of the capacitor Cn. The second terminal of the first resistor Rc is connected to the anode of the diode Dc. The cathode of the diode Dc is grounded. The over-voltage adjustment element 5 is connected in parallel with the capacitor Cn. One terminal of the over-voltage adjustment element 5 is connected to the low voltage end of the capacitor Cn, and the other end of the over-voltage adjustment element 5 is connected to the second end of the second resistor Rg, which is connected in series with the capacitor Cn. The second resistor Rg is used to limit the current of the pulse signal amplified by the power amplifying unit.

After receiving the pulse signal for turning off the power switch, if the voltage of the capacitor Cn decreases (for example, caused by leakage from a long time idle state or other interference factors), the negative voltage charge pump 9 can charge the capacitor Cn.

When the drive module receives the pulse signal that turns on the power switch, the first resistor Re and the diode Dc can charge the capacitor. In other embodiments of the present invention, other existing circuits can also be used to charge the capacitor when the pulse signal is at a high level (that is, the pulse signal for turning on the power switch), which is not limited herein.

The over-voltage adjustment element 5 is used to reduce the voltage of the capacitor to the predetermined voltage when the voltage of the capacitor exceeds the predetermined voltage. Preferably, the over-voltage adjustment element includes a Zener diode. The over-voltage adjustment element can reduce the excessive charging current when the capacitor is charging.

In the circuit shown in FIG. 5, the current source 2, the first switch Qc, and the second switch K form a charging unit. The charging unit is used to charge the capacitor Cn with a current source included in the charging unit when the drive circuit is started, and when the charging unit charges Cn, the low voltage end of Cn and the source of Q3 are both grounded. The charging unit can quickly charge Cn when the drive circuit is started or restarted. In addition, since the capacitance adjustment unit can maintain the voltage of Cn, it can maintain the negative voltage required for the power switch to turn off without requiring an additional voltage source. At the same time, when Cn is charging, the gate and source of Q3 are grounded at the same time to ensure that Q3 remains off during the time of charging Cn, thereby improving the charging efficiency of Cn while ensuring the reliability of the circuit. Specifically, the current source 2, the first switch Qc, the second resistor Rg, the capacitor Cn, and the second switch K are sequentially connected in series. The first terminal of the second switch K is connected to the low voltage end of Cn, and the second terminal of the second switch K is grounded. When charging Cn, the first switch Qc and the second switch K are turned on, and the current source 2, the first switch Qc, the second resistor Rg, the capacitor Cn and the second switch K form a current path. This helps to achieve fast charging of the capacitor Cn.

In other embodiments of the present invention, other charging units may also be used to charge the capacitor Cn. For example, a charging unit including a voltage source can be used. The embodiments are not limited herein.

When the drive circuit is started or restarted, after the capacitor has been charged to the required predetermined voltage, a low-power negative voltage charge pump can be used to charge the capacitor in which leakage occurs. The low-power negative voltage charge pump helps to maintain the voltage of the capacitor at the predetermined voltage, thereby maintaining the negative voltage for a long time. At the same time, this method saves the circuit area and reduces the circuit cost. In addition, in other examples of the present invention, other existing charging circuits can also be used to charge Cn, which is not limited herein.

In addition, in the circuit shown in FIG. 5, the power amplifier unit 1 is used to achieve the power amplifying function. The power amplifier unit 1 is respectively connected to the drive logic 4 and the second resistor Rg. The power amplifier unit 1 is used to amplify the pulse signal received from the drive logic 4 and output it to the second resistor Rg, thereby controlling the on and off of Q3.

In the circuit shown in FIG. 5, the under-voltage monitor UVLO 3, the under-voltage monitor UVLO 6, the drive logic 4 and the start logic unit 7 form a control unit. The control unit is used for turning off the power switch through a clamping circuit when the power supply voltage is lower than a first predetermined voltage and/or the voltage of the capacitor circuit is lower than a second predetermined voltage. It should be understood that the second predetermined voltage here is much smaller than the predetermined voltage of the capacitor, such as the case where the capacitor circuit is short-circuited. Specifically, the under-voltage monitors 3 and 6 are connected to the drive logic 4 and the start logic unit 7. When the under-voltage monitors 3 and 6 detect that the power supply voltage VDD is lower than the first predetermined voltage and/or the voltage Vcn of the capacitor Cn is lower than the second predetermined voltage, the start logic unit 2 will output a signal to the drive logic 4. The drive logic 4 reduces the gate voltage of Q3 to zero by controlling the Miller clamp pin (e.g., the clamp circuit), thereby turning off O3, which plays a role in circuit protection.

In addition, the control unit is also used to control the on and off of the first switch Qc and the second switch K in the above-mentioned charging unit to control whether the capacitor Cn is charged.

It can be understood that the control unit can also use other devices to implement its functions based on the prior art, which is not limited herein. In addition, in other embodiments of the present invention, other circuits can also be used to achieve the same function of the negative voltage pump here, which is not limited herein.

The operating principle of the circuit shown in FIG. 5 is as follows:

When the drive circuit is started or restarted, the capacitor Cn does not store charge. The control unit will control the first switch Qc and the second switch K transitioning from a turn-off state to a turn-on state. The current source 2, the first switch Qc, the second resistor Rg, the capacitor Cn and the second switch K form a current path to quickly charge the capacitor Cn. At the same time, the source and gate of Q3 are both grounded, and Q3 is cut off. During this period, if the charging voltage of Cn exceeds a predetermined voltage value, the over-voltage adjustment element will clamp it.

After the capacitor has been charged, when the pulse signal is a turn-on signal, the high-level turn-on signal is amplified by the power amplifying unit. The voltage at the high voltage terminal of Cn rises, and Q3 is turned on. During this period, if Cn leaks, the circuit comprising Re and Dc can charge Cn which has a reduced voltage, and if the charging voltage of Cn exceeds the predetermined value, the over-voltage adjustment element will clamp it.

When the pulse signal module outputs a low-level turn-off signal such as zero volts, Cn provides a negative voltage to the gate of Q3, so that Q3 is turned off. During this period, if Cn leaks or other conditions cause the voltage of Cn to decrease, the negative voltage charge pump 9 will charge it.

In the above process, if the Cn voltage or VDD is extremely reduced (such as zero volts) caused by a short circuit of Cn or other reasons, the start logic unit 7 will output a signal to the drive logic 4, which will control Q3. The gate voltage of Q3 is reduced to zero for achieving circuit protection.

Figure 6:
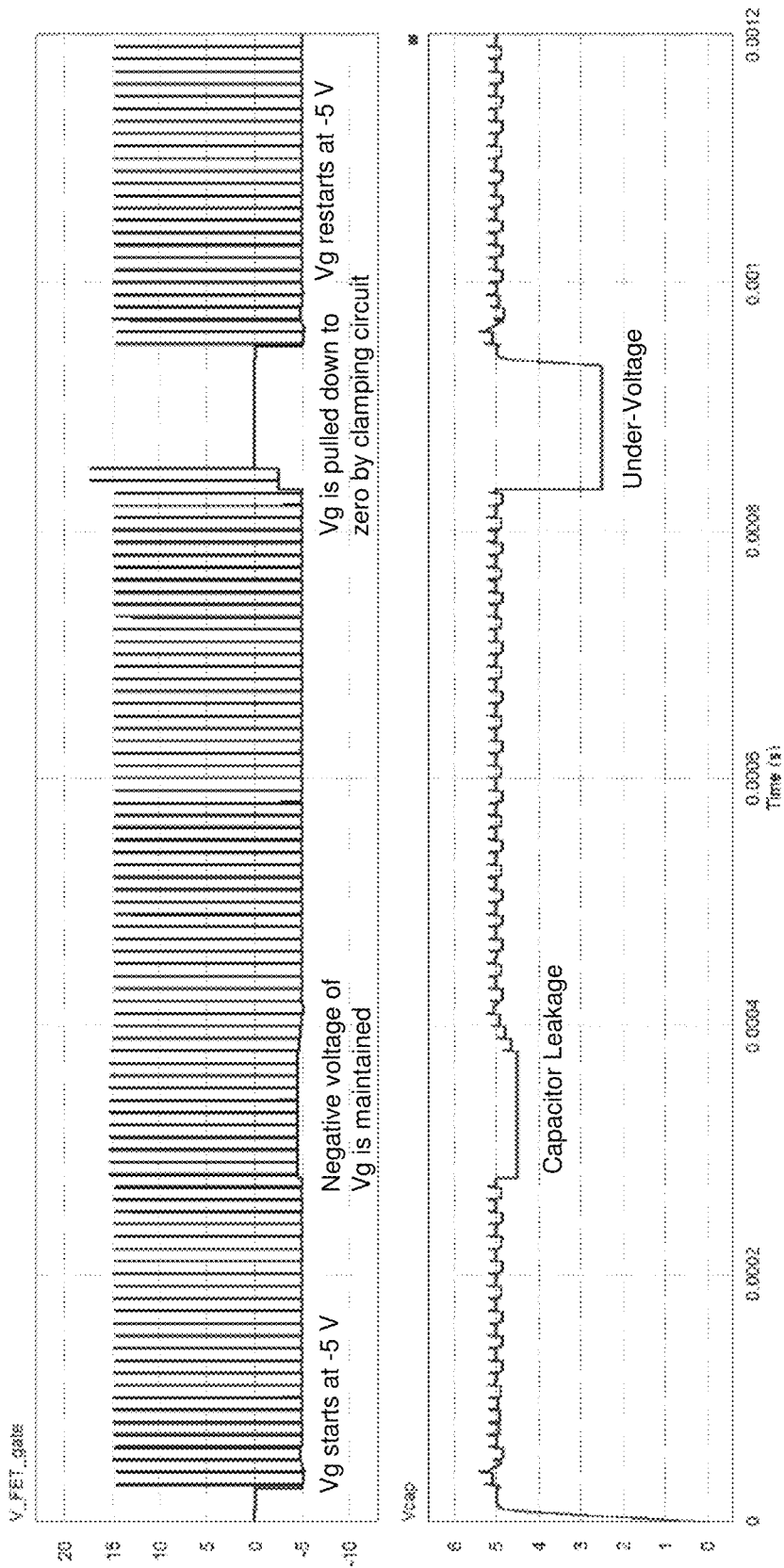
FIG. 6 is the simulation result of the gate voltage of the power switch in the circuit shown in FIG. 5.

FIG. 6 shows the simulation result of the circuit shown in FIG. 5. As can be seen from FIG. 6, when the capacitor leaks, the negative voltage at the gate of Q3 is maintained, that is, the voltage is maintained at the predetermined voltage. When an under-voltage condition occurs (that is, VDD or Vcn is severely reduced), Vg is pulled down to the ground voltage.

The invention does not require an additional power source, and can timely supplement the voltage loss caused by leakage or slight interference to the capacitor when the pulse signal is a turn-off signal for a long time, such as an idle time, so as to provide a stable turn-off negative voltage for the power switch.

In practical applications, the above-mentioned drive circuit may be a separate integrated circuit or a non-integrated circuit, which is not limited herein.

It can be understood that in other exemplary embodiments of the present invention, the circuit shown in FIG. 5 may not include the first resistor Re and the diode Dc, and the negative voltage charge pump 9 charges the capacitor Cn when the pulse signal is an on signal.

The second embodiment of the present invention relates to a drive device including the drive circuit of the first embodiment and the capacitor circuit.

The third embodiment of the present invention relates to a drive device including the drive circuit of the first embodiment, a capacitor circuit, and a pulse circuit that generates a pulse signal.

It should be noted that in the claims and specification of this patent, relational terms such as first and second are only used to distinguish one entity or operation from another entity or operation, and do not necessarily require or imply that there is any such actual relationship or order between these entities or operations. Moreover, the terms "include", "comprise" or any other variants thereof are intended to cover non-exclusive inclusion, so that a process, method, article, or device including a series of elements. It includes not only those elements, but also includes other elements. It also includes elements inherent to this process, method, article or equipment. If there are no more restrictions, the element defined by the phrase "comprising one" does not exclude the existence of other same elements in the process, method, article, or equipment including the element.

Although the present invention has been illustrated and described by referring to certain preferred embodiments of the present invention, those of ordinary skill in the art should understand that various changes can be made in form and details without departing from the spirit and scope of the present invention.

Although embodiments of the present disclosure have been described in detail, it should be understood that various changes, substitutions and alterations can be made herein without departing from the spirit and scope of the disclosure as defined by the appended claims.

Moreover, the scope of the present disclosure is not intended to be limited to the particular embodiments described here. As one of ordinary skill in the art will readily appreciate from the disclosure of the present disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed is:

1. An apparatus comprising:
a power switch;
a capacitor circuit coupled between an amplifier and a gate of the power switch; and
a negative voltage adjustment element connected in parallel with the capacitor circuit, wherein the negative voltage adjustment element is configured such that after a turn-off signal is applied to the gate of the power switch through the amplifier and the capacitor circuit, a capacitor of the capacitor circuit is charged by the negative voltage adjustment element, and as a result of charging the capacitor, a voltage of the capacitor is maintained at a predetermined voltage level.

2. The apparatus of claim 1, wherein:
the negative voltage adjustment element is a negative voltage charge pump; and
the capacitor circuit comprises a gate drive resistor and the capacitor connected in series.

3. The apparatus of claim 1, wherein:
the power switch is selected from the group consisting of a silicon carbide (SiC) metal oxide semiconductor field effect transistor (MOSFET), a silicon MOSFET or an insulated-gate bipolar transistor (IGBT).

4. The apparatus of claim 1, further comprising:
a startup charging circuit configured to charge the capacitor during a startup process of the apparatus, wherein after the startup process finishes, the negative voltage adjustment element is configured to charge the capacitor.

5. The apparatus of claim 4, wherein:
the startup charging circuit comprises a current source, a first switch and a second switch, and wherein the first switch, the capacitor circuit and the second switch are connected in series between the current source and ground.

6. The apparatus of claim 5, wherein:
during the startup process of the apparatus, the current source is configured to charge the capacitor; and
during the startup process of the apparatus, the gate and a source of the power switch are connected to a same voltage potential.

7. The apparatus of claim 1, further comprising:
an over-voltage adjustment element connected in parallel with the capacitor circuit, wherein the over-voltage adjustment element is configured to clamp the voltage of the capacitor to a predetermined voltage value when the voltage of the capacitor exceeds the predetermined voltage value.

8. The apparatus of claim 1, wherein:
the capacitor circuit is configured to provide a negative voltage applied to the gate of the power switch after a turn-off signal is fed into the amplifier.

9. The apparatus of claim 1, further comprising:
a positive voltage adjustment element coupled between the gate of the power switch and ground, wherein the positive voltage adjustment element is configured such that after a turn-on signal is applied to the gate of the power switch through the amplifier and the capacitor circuit, the capacitor of the capacitor circuit is charged by the positive voltage adjustment element.

10. The apparatus of claim 9, wherein:
the positive voltage adjustment element comprises a resistor and a diode connected in series between the gate of the power switch and ground.

11. A method comprising:
during a startup process of a driver of a power switch, charging a capacitor using a first charging circuit, wherein the capacitor is coupled between the driver and a control terminal of the power switch; and
after the startup process of the driver finishes, charging the capacitor using a negative voltage adjustment element, wherein the capacitor is configured to provide a negative voltage for the control terminal of the power switch after a turn-off signal is fed into the driver.

12. The method of claim 11, further comprising:
charging the capacitor using a positive voltage adjustment element after a turn-on signal is fed into the driver, wherein the positive voltage adjustment element comprises a resistor and diode connected in serious between the control terminal of the power switch and ground.

13. The method of claim 11, further comprising:
clamping a voltage of the capacitor to a predetermined voltage through an over-voltage adjustment element coupled in parallel with the capacitor.

14. The method of claim 11, wherein:
the first charging circuit comprises a current source, a first switch and a second switch, and wherein the first switch, the capacitor and the second switch are coupled in series between the current source and ground.

15. The method of claim 11, further comprising:
detecting a first voltage level of a power supply providing power for the driver;
detecting a second voltage level across the capacitor; and
turning off the power switch after the first voltage level is less than a predetermined power supply voltage and/or the second voltage level is less than a predetermined capacitor voltage.

16. A system comprising:
a power switch;
a capacitor circuit coupled to a control terminal of the power switch;
an amplifier configured to receive a pulse signal and generate an amplified signal applied to the control terminal of the power switch through the capacitor circuit;
a negative voltage adjustment element connected in parallel with the capacitor circuit; and
a startup capacitor charging circuit configured to charge a capacitor of the capacitor circuit during a startup process of the system.

17. The system of claim 16, wherein:
the negative voltage adjustment element is configured such that after a turn-off signal is applied to the control terminal of the power switch through the amplifier and the capacitor circuit, the capacitor of the capacitor circuit is charged by the negative voltage adjustment element, and as a result of charging the capacitor, a voltage of the capacitor is maintained at a predetermined voltage level, and a negative voltage is applied to the control terminal of the power switch.

18. The system of claim 16, further comprising:
a positive voltage adjustment element coupled between the control terminal of the power switch and ground, wherein the positive voltage adjustment element is configured such that after a turn-on signal is applied to the control terminal of the power switch through the amplifier and the capacitor circuit, the capacitor of the capacitor circuit is charged by the positive voltage adjustment element.

19. The system of claim 16, further comprising:
an over-voltage adjustment element connected in parallel with the capacitor circuit, wherein the over-voltage adjustment element is configured to clamp a voltage of the capacitor to a predetermined voltage value when the voltage of the capacitor exceeds the predetermined voltage value.

20. The system of claim 16, wherein:
the capacitor circuit comprises a resistor and the capacitor connected in series between an output of the amplifier and the control terminal of the power switch, and wherein the control terminal is a gate, and the power switch is a SiC transistor.

* * * * *